(12) United States Patent
Jeong

(10) Patent No.: US 7,514,337 B2
(45) Date of Patent: Apr. 7, 2009

(54) SEMICONDUCTOR DEVICE USING EPI-LAYER AND METHOD OF FORMING THE SAME

(75) Inventor: Dae Ho Jeong, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 53 days.

(21) Appl. No.: 11/503,020

(22) Filed: Aug. 11, 2006

(65) Prior Publication Data
US 2007/0037360 A1 Feb. 15, 2007

(30) Foreign Application Priority Data
Aug. 11, 2005 (KR) .................. 10-2005-0073735

(51) Int. Cl.
*H01L 21/76* (2006.01)
(52) U.S. Cl. ............... 438/424; 438/425; 438/426; 438/427; 438/442; 438/452
(58) Field of Classification Search ............ 438/424, 438/425, 426, 427, 429, 439, 442, 452
See application file for complete search history.

(56) References Cited

U.S. PATENT DOCUMENTS 5,763,314 A * 6/1998 Chittipeddi ............ 438/400
6,005,279 A * 12/1999 Luning ............... 257/510
6,051,469 A * 4/2000 Sheu et al. ............ 438/270
6,432,781 B2 * 8/2002 Wasshuber ............ 438/289
7,170,109 B2 * 1/2007 Sugihara et al. ......... 257/192
2006/0131689 A1 * 6/2006 Tsukidate ............. 257/506

* cited by examiner

*Primary Examiner*—Andy Huynh
(74) *Attorney, Agent, or Firm*—Andrew D. Fortney

(57) ABSTRACT

A method of fabricating a semiconductor device includes forming a pad oxide film and a nitride film on a semiconductor substrate; exposing the semiconductor substrate by selectively etching the pad oxide film and the nitride film; forming a trench in the exposed semiconductor substrate; forming a gap-fill dielectric film in the trench; exposing an active area of the semiconductor substrate by removing the pad oxide film and the nitride film; forming an epitaxial layer including a dopant in the exposed active area; forming a gate electrode on the epitaxial layer; and forming source and drain regions in the active area beside the gate electrode. The semiconductor device can prevent surface damage of a semiconductor substrate, may occur when performing ion implantation for threshold voltage control, and does not require annealing after ion implantation. Additionally, the semiconductor device can enhance an isolation effect by protecting an oxide film in a corner portion of the STI, to prevent an occurrence of a moat phenomenon in the STI, and to prevent the damage of the gap-fill dielectric film.

8 Claims, 6 Drawing Sheets

SEMICONDUCTOR DEVICE USING EPI-LAYER AND METHOD OF FORMING THE SAME

This application claims the benefit of Korean Application No. 10-2005-0073735, filed on Aug. 11, 2005, which is incorporated by reference herein in its entirety.

BACKGROUND OF THE INVENTION

1. Field of the Invention

The present invention relates to a semiconductor device and a formation method thereof, and more particularly, to a semiconductor device and a method of fabricating the same, in which has an epitaxial layer for controlling a threshold voltage.

2. Description of the Related Art

In general, various ion implantations are processed for embodying electric property of a MOS-transistor. Ion implantation is a process wherein impurity atoms are ionized and accelerated in an electric field to be implanted into a wafer, for the sake of substituting an impurity doping process by a high-temperature diffusion in a semiconductor device.

Ion implantation is both to control a dose of the impurity accurately and to control a distribution shape of the implanted ions. Additionally, Ion implantation has advantages that a lateral spread phenomenon is reduced in contrast to the high-temperature diffusion and a uniformity of impurity concentration in the wafer is excellent.

Ion implantation is used for threshold voltage control, punch through prevention, well formation, or isolation of circuit elements, etc., in MOS (Metal Oxide Semiconductor) transistors, and also for resistor formation, base formation, and isolation of devices, etc., in bipolar transistors.

However, the ions injected in the ion implantation apparatus are collided with a wafer, which can induce strains and defects. In order to overcome such problems, an annealing process is generally performed.

On the other hand, the semiconductor device generally comprises various electronic elements, such as transistors and capacitors formed on the semiconductor substrate, and wires that connect them with each other. To integrate such elements on the semiconductor substrate, it preferentially needs to isolate electrically regions where various electronic elements are formed, which is so-called "a device isolation."

LOCOS (Local Oxidation of Silicon) method, widely known as an isolation technique, involves forming an isolating oxide film on a field area to electrically isolate device active areas. However, a bird's beak phenomenon in the field area may occur. Namely, peripheral portions of the isolating oxide film may spread to reduce the active areas where circuit elements will be formed, thus resulting in decreasing a channel length and a punch through.

Recently, a STI (Shallow Trench Isolation) technique has been widely used to solve these problems. Advantages of the STI technique are both to minimize formation areas of dielectric films and to form a stable isolation structure. To explain isolation method using the STI technique, a silicon nitride film is firstly deposited on a semiconductor substrate on which an oxide thin film is previously formed, and it is patterned. Next, using the silicon nitride film as an etch-mask, the semiconductor substrate is etched to form a trench. After that, a liner oxide film is formed inside of the trench, and then the trench is sufficiently filled with a silicon oxide material. CMP (Chemical Mechanical Polishing) process is performed to planarize the patterned silicon nitride film until a surface thereof is exposed. Therefore, active areas in the semiconductor substrate are isolated by the silicon oxide film. For following processes in the isolated state, the patterned silicon nitride film remaining in the active area is removed.

However, there are such problems as the liner oxide film may be etched during a cleaning process prior to fabrication of a gate dielectric film. Moreover, a moat phenomenon, in which a STI gap-fill oxide film is etched, can also occur.

SUMMARY OF THE INVENTION

It is, therefore, an object of the present invention to provide a semiconductor device and a fabrication method thereof, in which a surface damage of a semiconductor substrate can be prevented that might otherwise occur during an ion implantation for controlling a threshold voltage. Especially, the present invention does not need to perform an annealing step after ion implantation.

In addition, another object of the present invention is to provide a semiconductor device and a fabrication method thereof, in which an isolation effect is enhanced by protecting an oxide film at a corner of a STI, thus preventing an occurrence or reducing the incidence and/or effect(s) of a moat phenomenon in the STI and damage to a gap-fill dielectric film.

To achieve the above objects, an embodiment of a formation method of fabricating the semiconductor device comprises the steps of: forming a pad oxide film and a nitride film on a semiconductor substrate; exposing the semiconductor substrate by selectively etching the pad oxide film and the nitride film; forming a trench in the exposed semiconductor substrate; forming a gap-fill dielectric film in the trench; exposing an active area of the semiconductor substrate by removing the pad oxide film and the nitride film; forming an epitaxial layer (for controlling a threshold voltage) including a dopant in the exposed active area; forming a gate conductive layer on a gate dielectric film on the epitaxial layer; forming a gate electrode by patterning the gate conductive layer; and forming a source region and a drain region at the active area beside the gate electrode.

According to the present invention, it is preferable to form the epitaxial layer horizontally surrounding the gap-fill dielectric film. Also, the liner oxide film can be formed in the trench after forming the trench. Additionally, the ion implantation can be performed before exposing the active area of the semiconductor substrate.

As described above, the present invention can reduce or prevent surface damage to a semiconductor substrate, which may occur when of performing an ion implantation for controlling a threshold voltage. Furthermore, one does not need to perform an anneal after ion implantation.

Moreover, the present invention can enhance an isolation effect by protecting an oxide film in a corner of the STI, to reduce or prevent the occurrence and/or effect(s) of a moat phenomenon in the STI, and to reduce or prevent damage to the gap-fill dielectric film.

DETAILED DESCRIPTION OF THE INVENTION

Figure 1:
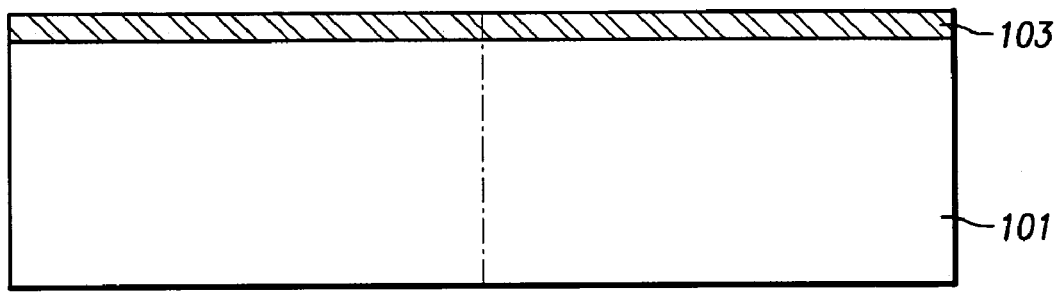
FIGS. 1 to 12 are cross-sectional views illustrating a method for fabricating a semiconductor device according to an embodiment of the present invention.

Hereinafter, a preferred embodiment of the present invention will be described in detail with reference to the accompanying drawings. A shape and thickness of a layer and a member are exaggerated or schematic in the drawings. The same reference numerals are used throughout the drawings to indicate the same elements.

Referring to FIG. 1, a pad oxide film 103 is formed in a thickness of 50~150 Å on a semiconductor substrate 101, using an oxygen gas and a hydrogen gas. The pad oxide film 103 mitigates stresses of the semiconductor substrate 101 and a nitride film to be formed hereafter, and protects the semiconductor substrate 101 in an ion implantation process, and further participates in a project region Rp of the ion implantation.

Figure 2:
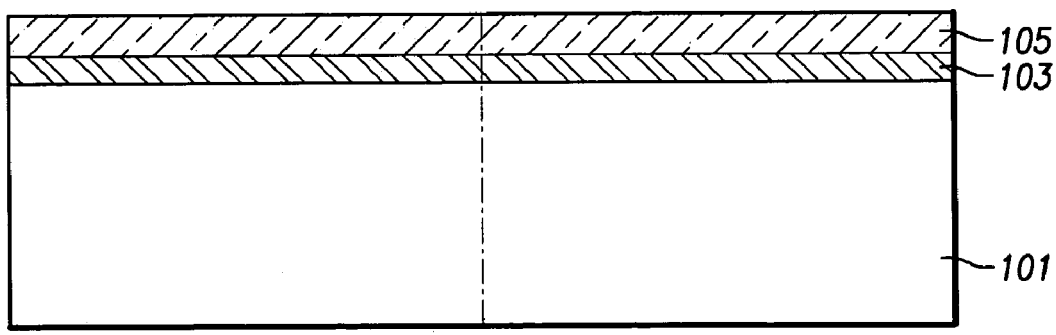

Referring to FIG. 2, a nitride film 105 is formed in a thickness of 1,000~3,000 Å on the pad oxide film 103, using $NH_3$ gas and $SiH_2Cl_2$ gas at a pressure of 0.2~0.25 torr. The nitride film 105 is used as an etch or polish stop layer for a subsequently-deposited gap-fill oxide film in the following process, i.e. a STI process.

Figure 3:
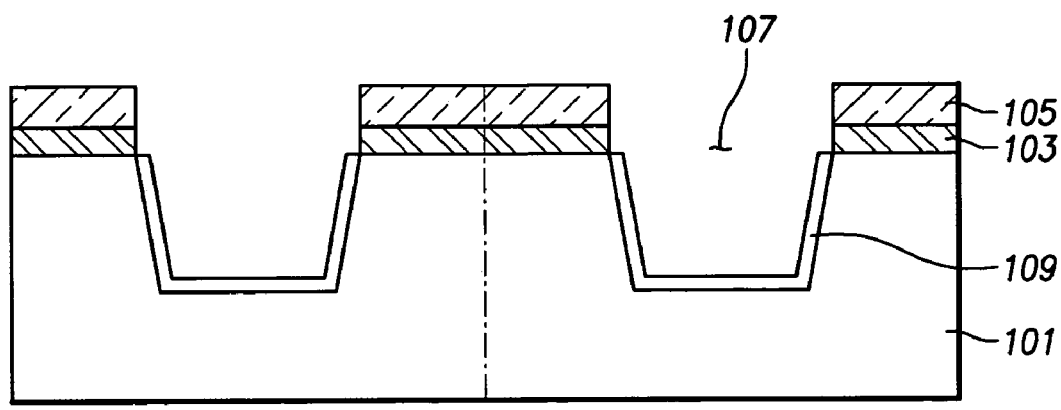

As shown in FIG. 3, the semiconductor substrate is exposed by general photolithography and etching processes. Specifically, the pad oxide film and the nitride film are selectively etched to expose a portion of the semiconductor substrate. Continuously, a trench 107 is formed having a depth of about 4,500 Å~6,000 Å by etching the exposed semiconductor substrate.

Subsequently, a liner oxide film 109 is formed by thermally oxidizing a surface of the trench 107 using an oxygen gas or a mixed gas of oxygen and hydrogen at a temperature of from 700° C. to 950° C. The liner oxide film 109 may have a predetermined thickness, for example, 100~250 Å. The liner oxide film 109 reduces etching damage that may have resulted from the trench formation process, and helps to form the gap-fill oxide film more easily.

Figure 4:
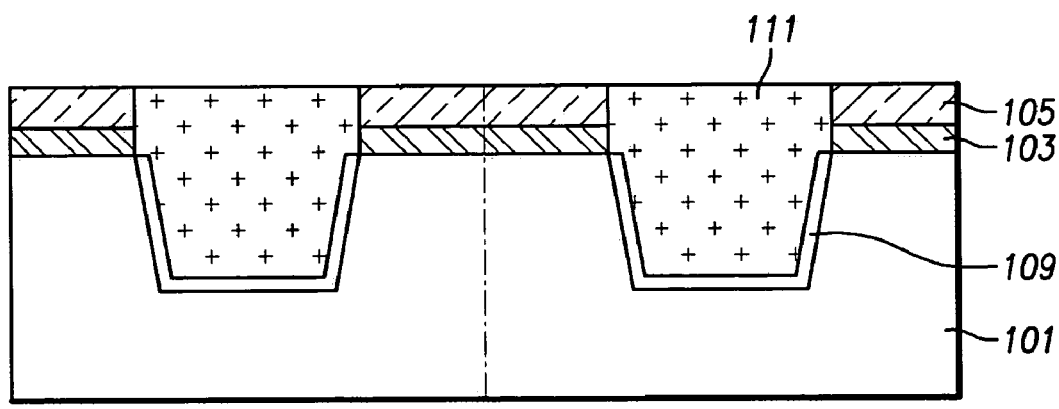

As shown in FIG. 4, a gap-fill dielectric film is formed, fully filling the trench 107, and then CMP (Chemical Mechanical Polishing) is performed until the nitride film 105 remains in a thickness of 1500~2500 Å, thus forming the gap-fill dielectric film 111 in the trench.

Figure 5:
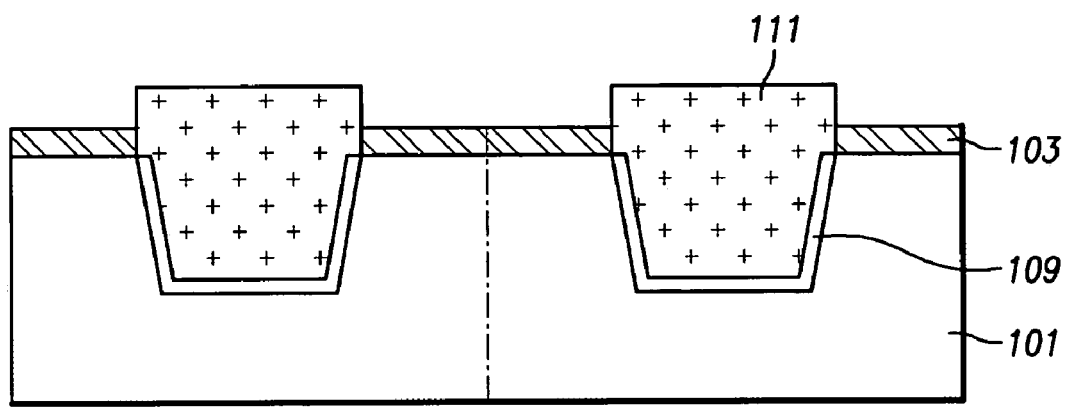

As shown in FIG. 5, the remaining nitride film 105 is removed, for example by wet etching. As the nitride film 105 is removed, a pad oxide film 103 loses about 10% of its thickness.

Figure 6:
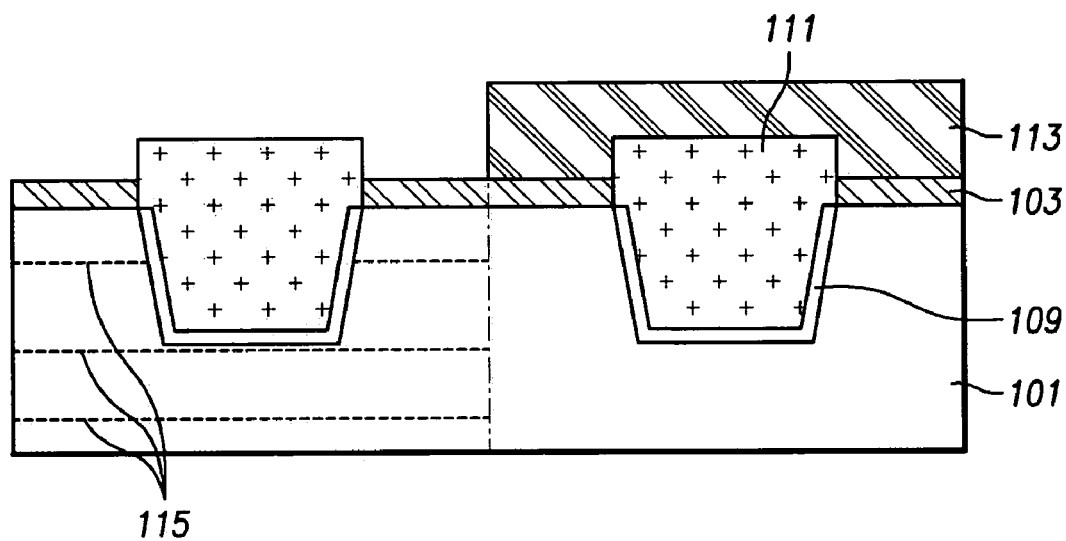

As shown in FIG. 6, a photoresist pattern 113 is formed to define a NMOS region, and plural ion-implantations, comprising a well ion implantation, a channel-stop ion implantation and a punch through ion implantation, are performed to form plural ion-implantation regions 115 in the NMOS region.

Figure 7:
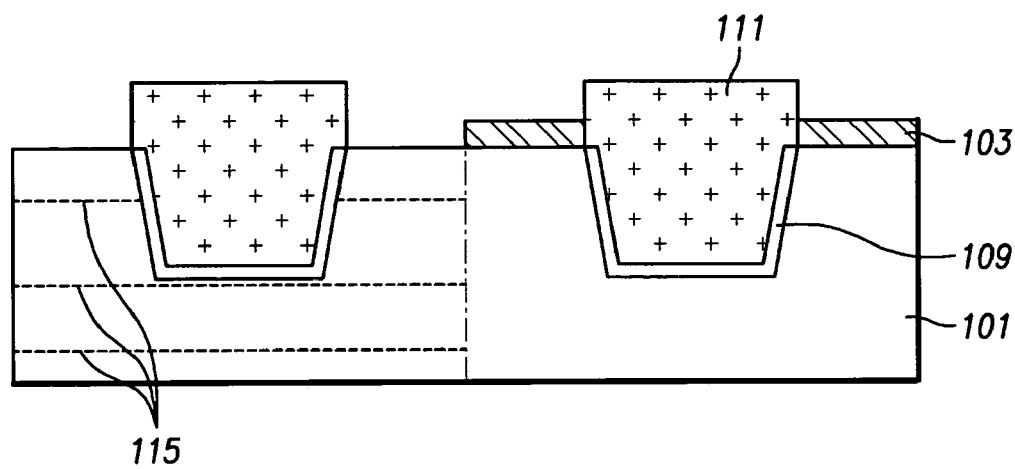

As shown in FIG. 7, the pad oxide film is removed in the NMOS region, and photoresist pattern 113 is removed.

Figure 8:
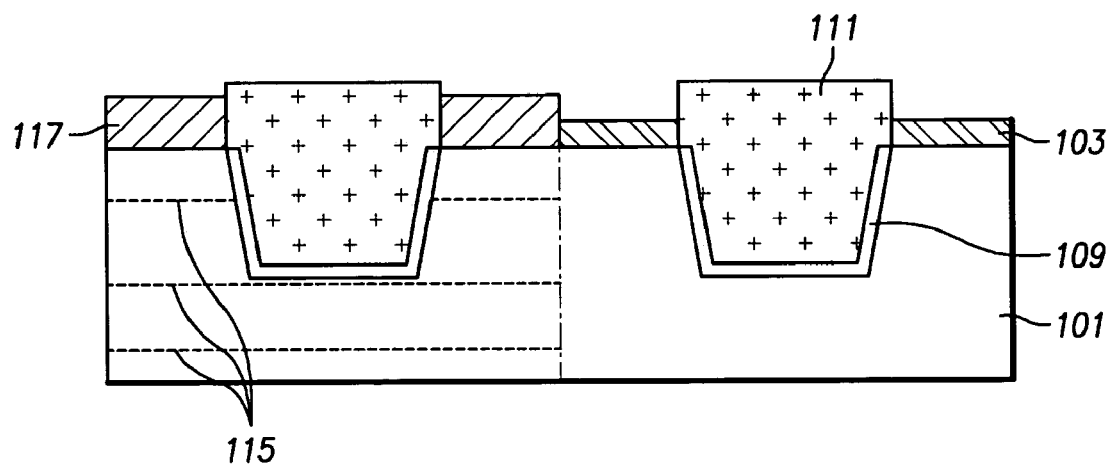

Referring to FIG. 8, an epitaxial layer 117 for controlling a threshold voltage is formed on the surface of an active region exposed in the NMOS region by SEG (Selective Epitaxial Growth) process. The epitaxial layer 117 for controlling a threshold voltage can be formed, using a (halo)silane such as TCS ($SiHCl_3$) or dichlorosilane ($SiH_2Cl_2$) under conditions comprising a temperature of 1000~1200° C., an atmospheric pressure of 760 torr (or such a pressure reduced by up to about 20 torr). Additionally, the epitaxial layer 117 can be doped using a (sila)borane such as $B_2H_6$, $B_5H_9$, $B_6H_{10}$ or $(H_3Si)_xBH_y$, ($1 \leq x \leq 3$, and x+y=3) as a dopant by introducing the (sila)borane gas into the epitaxy atmosphere and/or chamber. Generally, the dopant is introduced in an amount effective to control the threshold voltage of a subsequently-formed transistor (e.g., to result in the epitaxial layer having a concentration of the dopant in a range conventional for threshold voltage implants; for example, providing a dopant dose of from $10^{12}$ to $5 \times 10^{13}$ cm$^{-2}$). Since epitaxial silicon does not grow on silicon dioxide (e.g., gap-fill dielectric 111), and the substrate 101 adjacent to gap-fill dielectric 111 is exposed, the epitaxial layer 117 grows adjacent to gap-fill dielectric 111, surrounding and/or interfacing with gap-fill dielectric 111. In addition, the epitaxial layer 117 may be formed before removing photoresist pattern 113.

Figure 9:
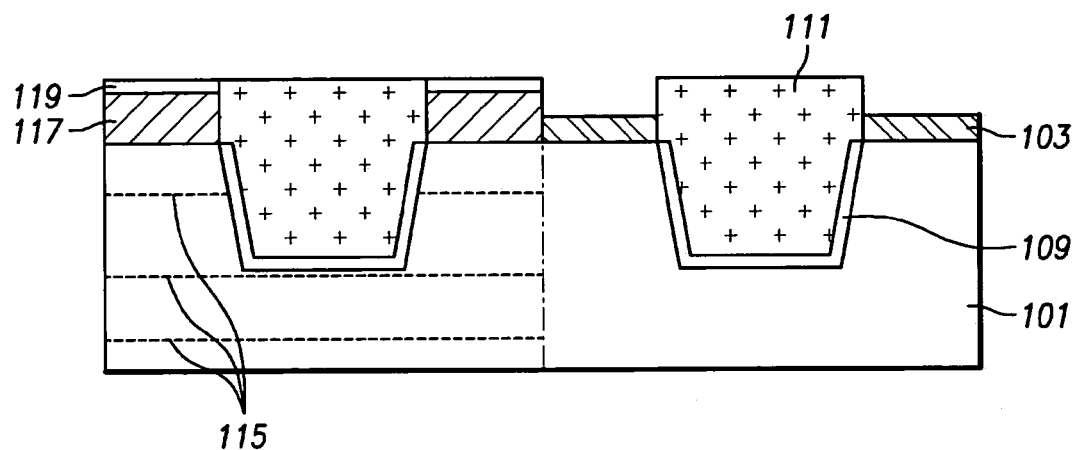

Referring to FIG. 9, an oxide film 119 is formed having a thickness of 50~100 Å over the substrate, by thermal growth or chemical vapor deposition (CVD). The oxide film 119 functions to activate dopants in the epitaxial layer 117. An additional oxide film may be formed on the pad oxide film 103 in a PMOS region, thus the pad oxide film 103 may be formed having a thickness of about 50~200 Å.

Figure 10:
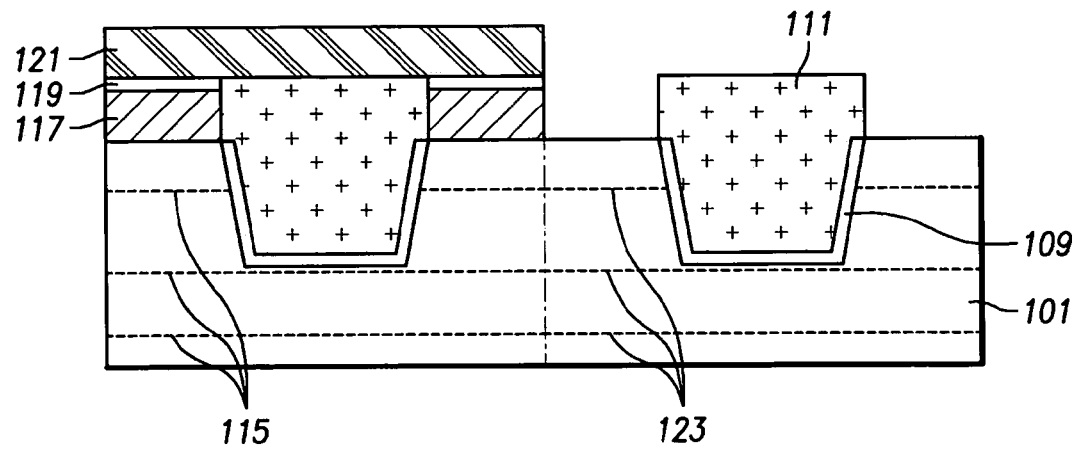

Referring to FIG. 10, a photoresist pattern 121 is formed to define a PMOS region, and plural ion implantation regions 123 are formed by performing ion implantations, comprising a well ion implantation, a channel-stop ion implantation and a punch through ion implantation. Thereafter, an active area of the PMOS region is exposed by removing the pad oxide film 103 in the PMOS region.

Figure 11:
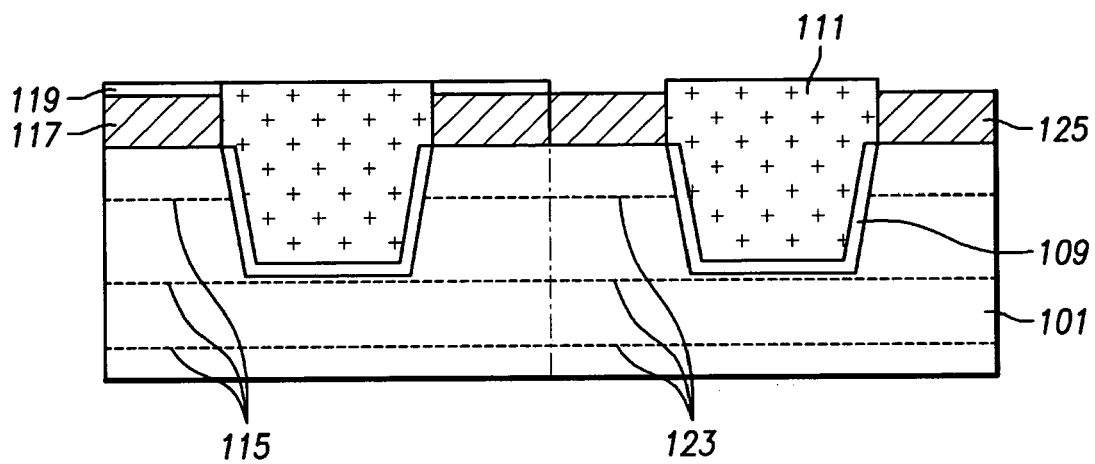

Referring to FIG. 11, an epitaxial layer 125 for controlling a threshold voltage is formed on the surface of an active region exposed in the PMOS region, using a SEG (Selective Epitaxial Growth) process as described with regard to FIG. 8. The epitaxial layer 125 for controlling a threshold voltage can be formed, using TCS ($SiHCl_3$) under conditions comprising a temperature of 1000~1200° C., an atmospheric pressure of 760 torr (or a pressure reduced by up to about 20 torr). Additionally, the epitaxial layer 125 can be doped using a (sila)phosphine such as $PH_3$ or $(H_3Si)_xPH_y$, ($1 \leq x \leq 3$, and x+y=3) as a dopant by introducing the (sila)phosphine gas into the epitaxy atmosphere and/or chamber. Generally, the dopant is introduced in an amount effective to control the threshold voltage of a subsequently-formed transistor (e.g., to result in the epitaxial layer having a concentration of the dopant in a range conventional for threshold voltage implants; for example, providing a dopant dose of from $10^{12}$ to $5 \times 10^{13}$ cm$^{-2}$). As described with regard to FIG. 8, the epitaxial layer 125 grows adjacent to gap-fill dielectric 111, surrounding and/or interfacing with gap-fill dielectric 111. In addition, the epitaxial layer 125 may be formed before removing photoresist pattern 113.

The epitaxial layer 125 can have a thickness of about 600~900 Å on the active PMOS region because of the remaining oxide film 119 on the NMOS region. Therefore, corner portions of the liner oxide film 109 and the gap-fill dielectric film 111 may be protected by the epitaxial layers 117 and 125 in the subsequent cleaning process, and corner portions of the liner oxide film 109 and the gap-fill dielectric film 111 are generally not removed.

Figure 12:
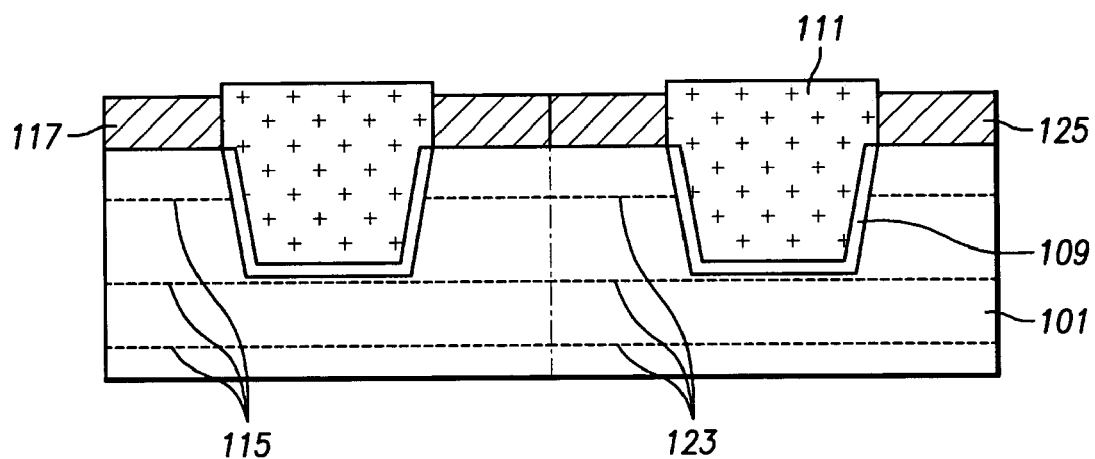

Referring to FIG. 12, the oxide film 119 on the NMOS region is removed.

Hereinafter, subsequent processes are performed according to typical manufacturing processes of a general MOS transistor. Namely, the subsequent processes involve: forming a gate dielectric film on the epitaxial layers, either by (i) thermal growth or (ii) CVD and annealing; stacking (e.g., depositing) a gate conductive layer on the gate dielectric film; forming a gate electrode by patterning the gate conductive layer; and forming source/drain regions in the active area adjacent to the gate electrode, thus forming the MOS transistor.

While the invention has been particularly shown and described with reference to the preferred embodiments thereof, it will be understood by those skilled in the art that various changes in form and detail may be made therein without departing from the sprit and scope of the invention as defined by the appended claims.

What is claimed is:

1. A method of forming a semiconductor device, comprising the steps of:
    forming a pad oxide film and a nitride film on a semiconductor substrate;
    exposing the semiconductor substrate by selectively etching the pad oxide film and the nitride film;
    forming a trench in the exposed semiconductor substrate;
    forming a gap-fill dielectric film in the trench;
    removing the nitride film by wet etching;
    forming a plurality of ion implantation regions by performing a well ion implantation, a channel-stop ion implantation, and a punch through ion implantation into the semiconductor substrate after forming the gap-fill dielectric;
    exposing an active area of the semiconductor substrate by removing the pad oxide film;
    forming an epitaxial layer containing a dopant in the exposed active area by epitaxial growth, the epitaxial layer interfacing with the gap-fill dielectric film and containing sufficient dopant to control a threshold voltage of the semiconductor device;
    forming a gate conductive layer on a gate dielectric film on the epitaxial layer;
    forming a gate electrode by patterning the gate conductive layer; and
    forming a source region and a drain region in the active area beside the gate electrode.

2. The method of claim 1, wherein forming the epitaxial layer comprises a SEG (Selective Epitaxial Growth) process, such that the epitaxial layer surrounds the gap-fill dielectric film.

3. The method of claim 1, further comprising the step of forming a liner oxide film having a thickness of 100~250 Å inside the trench, after forming the trench.

4. The method of claim 1, wherein forming the epitaxial layer comprises forming a first epitaxial layer doped with a P-type dopant in an NMOS region of the substrate, and forming a second epitaxial layer doped with an N-type dopant in a PMOS region of the substrate.

5. The method of claim 4, wherein forming a first epitaxial layer doped with a P-type dopant comprises introducing a P-type dopant precursor into the epitaxy atmosphere and/or chamber during the epitaxial growth process.

6. The method of claim 4, wherein forming a first epitaxial layer doped with an N-type dopant comprises introducing an N-type dopant precursor into the epitaxy atmosphere and/or chamber during the epitaxial growth process.

7. The method of claim 6, wherein said P-type dopant precursor comprises one or more compound(s) selected from the group consisting of $B_2H_6$, $B_5H_9$, $B_6H_{10}$, or $(H_3Si)_x\text{-}BH_y$, where $1 \leq x \leq 3$, and $x+y=3$.

8. The method of claim 6, wherein said N-type dopant precursor comprises one or more compound(s) selected from the group consisting of $PH_3$ or $(H_3Si)_xPH_y$, where $1 \leq x \leq 3$, and $x+y=3$.

* * * * *